(12) United States Patent
Zhao et al.

(10) Patent No.: US 12,432,938 B2
(45) Date of Patent: Sep. 30, 2025

(54) MEMORY ARRAY, MEMORY, PREPARING METHOD AND WRITING METHOD

(71) Applicant: BEIHANG UNIVERSITY, Beijing (CN)

(72) Inventors: Weisheng Zhao, Beijing (CN); Jingle Chen, Beijing (CN); Kaihua Cao, Beijing (CN); Gefei Wang, Beijing (CN)

(73) Assignee: BEIHANG UNIVERSITY, Beijing (CN)

( * ) Notice: Subject to any disclaimer, the term of this patent is extended or adjusted under 35 U.S.C. 154(b) by 166 days.

(21) Appl. No.: 18/359,224

(22) Filed: Jul. 26, 2023

(65) Prior Publication Data

US 2024/0023347 A1    Jan. 18, 2024

Related U.S. Application Data

(63) Continuation of application No. PCT/CN2021/074299, filed on Jan. 29, 2021.

(51) Int. Cl.
*G11C 11/00* (2006.01)
*G11C 11/16* (2006.01)
(Continued)

(52) U.S. Cl.
CPC .......... *H10B 80/00* (2023.02); *G11C 11/1659* (2013.01); *G11C 11/1675* (2013.01);
(Continued)

(58) Field of Classification Search
CPC ......... H10B 80/00; H10B 61/22; H01L 24/08; H01L 24/80; H01L 25/0657; H01L 25/18;
(Continued)

(56) References Cited

U.S. PATENT DOCUMENTS 6,391,658 B1 * 5/2002 Gates ................... B82Y 10/00
                                                      438/455
9,218,864 B1 * 12/2015 Yi ....................... G11C 11/1659
(Continued)

FOREIGN PATENT DOCUMENTS

CN        106229004 A     12/2016
CN        106875969 A      6/2017
(Continued)

OTHER PUBLICATIONS

International Search Report issued in corresponding PCT Application No. PCT/CN2021/074299, dated Nov. 2, 2021.
(Continued)

*Primary Examiner* — Viet Q Nguyen
(74) *Attorney, Agent, or Firm* — Westbridge IP LLC

(57) ABSTRACT

Disclosed are a memory array, a memory, a preparing method and a writing method. Some embodiments relate to a memory array for a magnetoresistive random access memory and a manufacturing method thereof. The memory array includes: a plurality of memory cells arranged in an array and a conductor layer; each of the memory cells includes: a write transistor, a first end of which is coupled to top electrode wiring; a magnetic tunnel junction MTJ, one end of which close to a reference layer is coupled to a second end of the write transistor; a side surface of the conductor layer is coupled to end faces of one end of all of the magnetic tunnel junctions MTJs close to a free layer.

8 Claims, 7 Drawing Sheets

(51) Int. Cl.
*H01L 23/00* (2006.01)
*H01L 25/00* (2006.01)
*H01L 25/065* (2023.01)
*H01L 25/18* (2023.01)
*H10B 61/00* (2023.01)
*H10B 80/00* (2023.01)

(52) U.S. Cl.
CPC .............. *H01L 24/08* (2013.01); *H01L 24/80* (2013.01); *H01L 25/0657* (2013.01); *H01L 25/18* (2013.01); *H01L 25/50* (2013.01); *H10B 61/22* (2023.02); *H01L 2224/08145* (2013.01); *H01L 2224/80895* (2013.01); *H01L 2224/80896* (2013.01); *H01L 2924/1431* (2013.01); *H01L 2924/1443* (2013.01)

(58) Field of Classification Search
CPC ........... H01L 25/50; H01L 2224/08145; H01L 2224/80895; H01L 2224/80896; H01L 2924/1431; H01L 2924/1443; G11C 11/1659; G11C 11/1675
USPC .......................................................... 365/158
See application file for complete search history.

(56) References Cited

U.S. PATENT DOCUMENTS

| | | | |
|---|---|---|---|
| 9,734,883 B1 | 8/2017 | Yu et al. | |
| 10,217,798 B2 * | 2/2019 | Hu | H10D 30/675 |
| 11,527,709 B2 * | 12/2022 | Gupta | H10N 50/85 |
| 11,765,908 B1 * | 9/2023 | Manfrini | H10B 53/30 |
| | | | 438/3 |
| 12,068,014 B2 * | 8/2024 | Uchida | G11B 5/3912 |
| 2015/0213866 A1 * | 7/2015 | Wu | G11C 11/16 |
| | | | 365/158 |
| 2016/0020250 A1 * | 1/2016 | Li | H10B 61/22 |
| | | | 365/158 |
| 2017/0025601 A1 * | 1/2017 | Bhushan | H01L 23/49816 |
| 2017/0365777 A1 | 12/2017 | Mihajlovic et al. | |
| 2018/0204867 A1 * | 7/2018 | Kim | H01L 24/80 |
| 2019/0027535 A1 * | 1/2019 | Kumar | H10B 61/00 |
| 2019/0074429 A1 * | 3/2019 | Karpov | H10N 50/80 |
| 2019/0206939 A1 * | 7/2019 | Bozdag | G11C 11/00 |
| 2019/0363131 A1 * | 11/2019 | Torng | H10N 70/883 |
| 2020/0136016 A1 * | 4/2020 | Lin | H01F 41/307 |
| 2020/0279597 A1 | 9/2020 | Wang et al. | |
| 2023/0063125 A1 * | 3/2023 | Wei | H10N 50/01 |
| 2023/0067715 A1 * | 3/2023 | Yuh | H10D 30/6729 |
| 2023/0299042 A1 * | 9/2023 | Chen | H10B 63/80 |
| 2024/0114702 A1 * | 4/2024 | Chia | H10B 80/00 |
| 2024/0276735 A1 * | 8/2024 | Guha | H10D 1/716 |

FOREIGN PATENT DOCUMENTS

| | | |
|---|---|---|
| CN | 107919375 A | 4/2018 |
| CN | 109643567 A | 4/2019 |
| CN | 111740011 A | 10/2020 |
| CN | 112186096 A | 1/2021 |
| CN | 112186098 A | 1/2021 |
| WO | 2020166141 A1 | 8/2020 |

OTHER PUBLICATIONS

First Office Action issued in counterpart Chinese Patent Application No. 202110123708.6, dated May 31, 2022.
Supplementary Search Report issued in counterpart Chinese Patent Application No. 202110123708.6, dated Apr. 27, 2023.

* cited by examiner

MEMORY ARRAY, MEMORY, PREPARING METHOD AND WRITING METHOD

CROSS-REFERENCE TO RELATED APPLICATIONS

This application is a continuation of International Application No. PCT/CN2021/074299, filed on Jan. 29, 2021, the content of which is incorporated herein by reference in its entirety.

TECHNICAL FIELD

The present disclosure relates to the field of semiconductors and, particularly to a memory array, a memory, a preparing method and a writing method.

BACKGROUND

The Magnetoresistive random access memory (MRAM) has attracted great attention in academic and industrial fields because of its advantages such as non-volatility, radiation resistance and low power consumption. The magnetic tunnel junction (MTJ) is the basic memory cell of the MRAM. The core of the MTJ consists of two magnetic metal layers and a barrier layer interposed therebetween. One of the magnetic metal layers, called a reference layer, has a fixed magnetization. The other of the magnetic metal layers, called a free layer, has two stable orientations for the magnetization. The MTJ may be in two states, that is, the magnetization directions of the two magnetic layers are parallel (P) or antiparallel (AP) to each other, so that the MTJ is in a low-resistance state or a high-resistance state, which is called a tunnel magnetoresistance effect (TMR). The basic principle of the storage by the MRAM is to utilize the tunneling magnetoresistance effect, that is, the high-resistance state and the low-resistance state represent data '0' and '1' respectively.

One type of MRAM is a spin transfer torque magnetoresistive RAM (STT-MRAM), a write operation of which utilizes the spin transfer torque effect to flip the magnetization direction of the free magnetic layer, and a read operation of which is performed by the tunnel magnetoresistance effect of the magnetic tunnel junction. At present, write current directions of the STT-MRAM are opposite to each other when '0' and '1' are written. In the STT-MRAM write, the magnitude of current when the MTJ flips from parallel to antiparallel is inconsistent with that when the MTJ flips from antiparallel to parallel, that is, the STT flipping efficiency is asymmetric. On the other hand, as for a one-transistor-one-MTJ cell, since the two write current directions exist at the same time, a source degradation phenomenon occurs in a certain current direction. These two aspects jointly lead to the performance degradation of the STT-MRAM. In addition, the STT-MRAM is also limited by the inherent flip time delay of the STT effect, which greatly affects the write speed of the STT-MRAM.

The other type of MRAM is a spin orbit torque magnetoresistive RAM (SOT-MRAM). The basic cell structure of the SOT-MRAM is composed of an MTJ, a heavy metal layer or a ferromagnetic layer and two access transistors. The MTJ is composed of a free layer, a barrier layer, a reference layer and a pinning layer from bottom to top, a heavy metal or an antiferromagnetic layer is disposed below the free layer of the MTJ, and current flowing through the heavy metal or the antiferromagnetic layer can induce a torque to flip the magnetization direction of the free layer of the MTJ to realize a magnetic write. In this technology, the SOT effect write solves the problem of the write speed. However, since the basic cell structure of the existing SOT-MRAM includes two access transistors, i.e., a write transistor and a read transistor, which have a same width, it is difficult to improve the integration density. Moreover, the problem of source degradation of the transistors still exists.

SUMMARY

The present disclosure provides a memory array, a memory, a preparing method and a writing method. Some embodiments relate to a memory array for a magnetoresistive random access memory and a manufacturing method thereof. The memory array includes: a plurality of memory cells arranged in an array and a conductor layer; each of the memory cells includes: a write transistor, a first end of which is coupled to top electrode wiring; a magnetic tunnel junction MTJ, one end of which close to a reference layer is coupled to a second end of the write transistor; a side surface of the conductor layer is coupled to end faces of one end of all of the magnetic tunnel junctions MTJs close to a free layer, wherein two ends of the conductor layer are coupled to high-level wiring and low-level wiring, respectively. The present disclosure applies both STT and SOT effects to the magnetic tunnel junction flipping; compared with the STT-MRAM, the magnetic memory of the present disclosure improves a write speed and a device reliability; and compared with the SOT-MRAM model, the magnetic memory of the present disclosure reduces a circuit static power consumption, decreases the number of the transistors and improves a device storage density.

An embodiment of a first aspect of the present disclosure provides a memory array for a magnetoresistive random access memory, including: a plurality of memory cells arranged in an array and a conductor layer; each of the memory cells includes:

a write transistor, a first end of which is coupled to top electrode wiring;
a magnetic tunnel junction MTJ, one end of which close to a reference layer is coupled to a second end of the write transistor;
a side surface of the conductor layer is coupled to end faces of one end of all of the magnetic tunnel junctions MTJs close to a free layer, wherein two ends of the conductor layer are coupled to high-level wiring and low-level wiring, respectively.

In some embodiments, all of the write transistors in the memory array are integrated in a first wafer, all of the magnetic tunnel junctions MTJs in the memory array are integrated in a second wafer, and the first wafer and the second wafer are connected together by bonding.

In some embodiments, both the high-level wiring and the low-level wiring are provided with switching elements.

In some embodiments, the conductor layer is elongated with a top area greater than bottom areas of all of the magnetic tunnel junctions, and bottom shapes of the magnetic tunnel junctions are completely embedded in a top shape of the conductor layer.

An embodiment of a second aspect of the present disclosure provides a memory, including: a plurality of memory array groups, each including a pair of memory arrays, high-level wiring and low-level wiring;

the memory array includes a plurality of memory cells arranged in an array and a conductor layer;
each of the memory cells includes:

a write transistor, a first end of which is coupled to top electrode wiring;

a magnetic tunnel junction MTJ, an end of which close to a reference layer is coupled to a second end of the write transistor;

a side surface of the conductor layer is coupled to end faces of one end of all of the magnetic tunnel junctions MTJs close to a free layer, wherein two ends of the conductor layer are coupled to the high-level wiring and the low-level wiring respectively.

In some embodiments, the high-level wiring is located between a pair of memory arrays in each of the memory array groups; ends of the conductor layers of the pair of memory arrays close to each other are coupled to the high-level wiring, respectively, and ends of the conductor layer of the pair of memory arrays facing away from each other are coupled to the low-level wiring, respectively.

In some embodiments, the low-level wiring is located between a pair of memory arrays in each of the memory array groups; ends of the conductor layers of the pair of memory arrays close to each other are coupled to the low-level wiring, respectively, and ends of the conductor layer of the pair of memory arrays facing away from each other are coupled to the high-level wiring, respectively.

An embodiment of a third aspect of the present disclosure provides a method for preparing a memory array, including:

forming a plurality of write transistors, and coupling first ends thereof to top electrode wiring;

forming a plurality of magnetic tunnel junctions MTJs corresponding to the write transistors one by one, and coupling ends of the magnetic tunnel junctions MTJs close to a reference layer to second ends of the write transistors;

forming a conductor layer, and coupling a side surface thereof to end faces of one end of all of the magnetic tunnel junctions MTJs close to a free layer; and coupling two ends of the conductor layer to high-level wiring and low-level wiring, respectively.

In some embodiments, the forming a plurality of write transistors includes:

integrating the plurality of write transistors in a first wafer;

the forming a plurality of magnetic tunnel junctions MTJs corresponding to the write transistors one by one includes:

integrating the plurality of magnetic tunnel junctions MTJs in a second wafer; and the coupling ends of the magnetic tunnel junctions MTJs close to a reference layer to second ends of the write transistors includes:

bonding the first wafer and the second wafer.

An embodiment of a fourth aspect of the present disclosure provides a method for writing data using the memory array according the embodiment of the first aspect, including:

turning on the high-level wiring and the low-level wiring, to set all of the magnetic tunnel junctions MTJs in the memory array in a first resistance state, wherein the first resistance state is corresponding to a first numerical value, and a second resistance state opposite to the first resistance state is corresponding to a second numerical value;

selecting the magnetic tunnel junction MTJ at a corresponding position according to the second numerical value written into a numerical value string and a position thereof in the numerical value string; and turning on the write transistor coupled to the magnetic tunnel junction MTJ and turning on one of the high-level wiring and the low-level wiring, to switch the magnetic tunnel junction MTJ at the corresponding position to the second resistance state.

Advantageous effects of the present disclosure:

The present disclosure provides a memory array, a memory, a preparing method and a writing method. Some embodiments relate to a memory array for a magnetoresistive random access memory and a manufacturing method thereof. The memory array includes: a plurality of memory cells arranged in an array and a conductor layer; each of the memory cells includes: a write transistor, a first end of which is coupled to top electrode wiring; a magnetic tunnel junction MTJ, one end of which close to a reference layer is coupled to a second end of the write transistor; a side surface of the conductor layer is coupled to end faces of one end of all of the magnetic tunnel junctions MTJs close to a free layer, wherein two ends of the conductor layer are coupled to high-level wiring and low-level wiring, respectively. The present disclosure applies both STT and SOT effects to the magnetic tunnel junction flipping; compared with the STT-MRAM, the magnetic memory of the present disclosure improves a write speed and a device reliability; and compared with the SOT-MRAM model, the magnetic memory of the present disclosure reduces a circuit static power consumption, decreases the number of the transistors and improves a device storage density.

BRIEF DESCRIPTION OF THE DRAWINGS

In order to more clearly explain the technical solutions in the embodiments of the present disclosure or in the related art, the drawings to be used in the description of the embodiments or the related art will be briefly introduced as follows. Obviously, the drawings used in the following description only illustrate some embodiments of the present disclosure, and those of ordinary skill in the art can obtain other drawings from them without paying any creative effort.

DETAILED DESCRIPTION OF THE EMBODIMENTS

Figure 1:
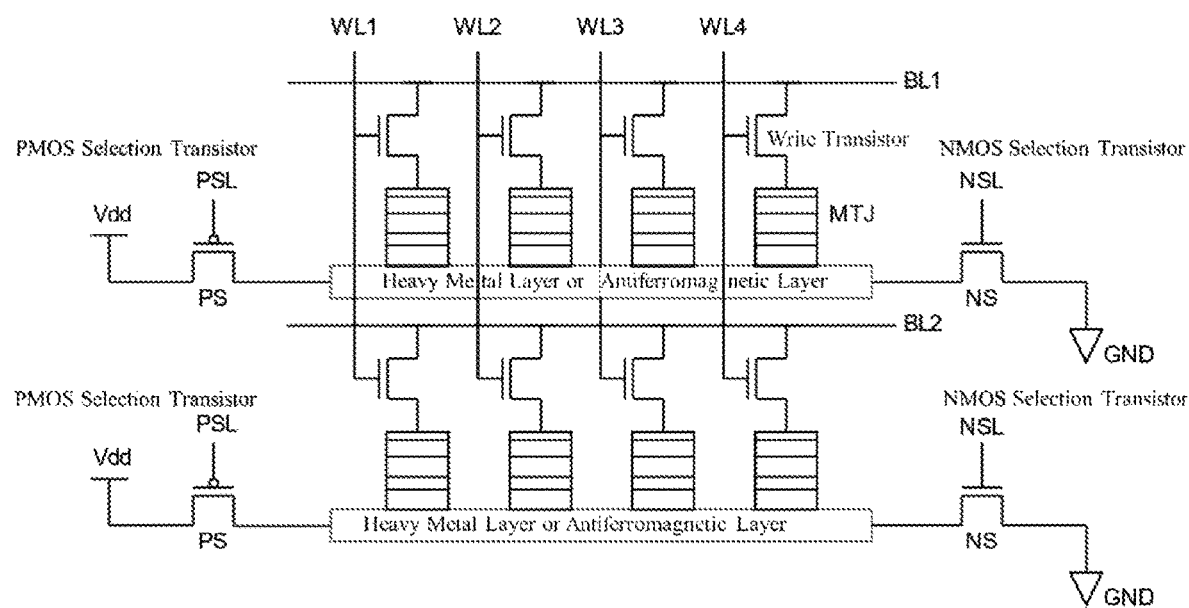
FIG. 1 illustrates a first structural diagram of a three-dimensional high-density NAND magnetic memory according to an embodiment of the present disclosure.

The technical solutions in the embodiments of the present disclosure will be clearly and completely described below in conjunction with the drawings for the embodiments of the present disclosure. Obviously, those described are merely a part, rather than all, of the embodiments of the present disclosure. Based on the embodiments of the present disclosure, any other embodiment obtained by those of ordinary skill in the art without paying any creative effort should fall within the protection scope of the present disclosure.

The following disclosure provides many different embodiments or examples for implementing different features of the present disclosure. Specific examples of components and arrangements are described below to simplify the present disclosure. Of course, these are only examples and are not intended to limit the present disclosure. For example, in the following description, forming a first component over or on a second component may include an embodiment in which the first component and the second component are in direct contact, and may also include an embodiment in which an additional component is formed therebetween so that the first component and the second component are not in direct contact. In addition, the present disclosure may repeat reference numerals and/or signs in various embodiments. This repetition is for simplicity and clarity, and is not, by itself, indicative of a relationship between the various embodiments and/or configurations discussed.

Moreover, for the convenience of description, spatial relative terms such as 'under', 'below', 'lower', 'on' and 'upper' can be used here to describe a relationship between an element or component and another element or component (or other elements or components) as illustrated. In addition to the illustrated orientations, the spatial relative terms are intended to include different orientations of devices in use or operation.

In the existing STT-MRAM, even if the magnetization direction of a free layer of the MTJ is flipped using the STT effect, the write current directions are opposite to each other when '0' and '1' are written. On the one hand, in STT-MRAM write, the magnitude of current when the MTJ flips from parallel to antiparallel is inconsistent with that when the MTJ flips from antiparallel to parallel, that is, the STT flipping efficiency is asymmetric. On the other hand, as for a one-transistor-one-MTJ cell, since the two write current directions exist at the same time, a source degradation phenomenon occurs in a certain current direction. These two aspects jointly lead to the performance degradation of the STT-MRAM.

The basic structure of the existing SOT-MRAM is composed of an MTJ, a heavy metal layer or a ferromagnetic layer and two access transistors, i.e., a write transistor and a read transistor. Under this technology, the write current is much larger than the read current. However, due to layout restrictions, the write transistor and the read transistor have the same width, and it is difficult to improve the integration density. Moreover, the problem of source degradation of the transistors still exists.

In order to solve the above problem, a first aspect of the present disclosure provides a memory array for a magnetoresistive random access memory, which includes a plurality of memory cells arranged in an array and a conductor layer; each of the memory cells includes: a write transistor, a first end of which is coupled to top electrode wiring; and a magnetic tunnel junction MTJ, an end of which close to a reference layer is coupled to a second end of the write transistor, a side surface of the conductor layer is coupled to end faces of one end of all of the magnetic tunnel junctions MTJs close to a free layer, wherein two ends of the conductor layer are coupled to high-level wiring and low-level wiring respectively.

The memory array in the embodiment of the present disclosure applies both STT and SOT effects to the magnetic tunnel junction flipping; compared with the STT-MRAM, the magnetic memory improves a write speed and a device reliability; and compared with the SOT-MRAM model, the magnetic memory reduces a circuit static power consumption, decreases the number of the transistors and improves a device storage density.

It can be understood that 'couple' in the embodiments of the present disclosure may include an embodiment in which a first component and a second component are in direct contact, and may also include an embodiment in which an additional component is formed therebetween so that the first component and the second component are not in direct contact.

The write transistor includes, but is not limited to a conventional transistor, a tunneling field effect transistor, a FinFET, and a vertical fully surrounding gate transistor.

A shape of the magnetic tunnel junction includes, but is not limited to a square, a rectangle, a circle or an ellipse.

The semiconductor processing technologies adopted in the embodiments of the present disclosure mainly include: exposure technologies such as deep ultraviolet lithography (DUV) and electron beam lithography (EBL); etching technologies such as inductively coupled plasma etching (ICP), capacitively coupled plasma etching (CCP) and ion beam etching (IBE); dielectric deposition technologies such as plasma enhanced chemical vapor deposition (PECVD) and chemical vapor deposition (CVD); and metal deposition technology such as magnetron sputtering.

FIG. 1 illustrates a first structural diagram of a three-dimensional high-density NAND magnetic memory according to an embodiment of the present disclosure. The NAND magnetic memory is a better storage scheme than a hard disk drive. This magnetic memory includes: a storage part that includes a magnetic tunnel junction MTJ and a conductor layer; and a control part that includes high-level wiring Vdd, low-level wiring GND, and a write transistor. A plurality of magnetic tunnel junctions are manufactured on the conductor layer; the main structure of the magnetic tunnel junction is composed of a first ferromagnetic metal layer, a first oxide layer, a second ferromagnetic metal layer, a first synthetic antiferromagnetic layer and an X-th top electrode from bottom to top; an X-th magnetic tunnel junction is interconnected with a source or a drain of an X-th write transistor through the X-th top electrode; and each of the magnetic tunnel junctions and the write transistor jointly represent a memory cell.

The conductor layer is an antiferromagnetic layer strip film or a heavy metal layer strip film, including but not limited to platinum, tantalum, tungsten, iridium manganese, platinum manganese.

The first ferromagnetic metal layer and the second ferromagnetic metal layer have the same or different thicknesses of 0 to 3 nm, and both of the magnetic layers are composed of a magnetic material, including but not limited to a homogenous ferromagnetic material, such as iron, cobalt, nickel; or a mixed metal material, such as cobalt iron, cobalt iron boron, nickel iron, wherein the elements in the mixed metal material has different proportions. The structure includes, but is not limited to, a single-layer film, a double-layer film and a multi-layer film.

Of course, only one form of the specific size and the material composition of this embodiment is illustrated here, and those skilled in the art can understand that the selection of the specific thickness and material will not have a substantive impact. On the premise of not affecting the main idea of the present disclosure, those skilled in the art are able to select other thicknesses and materials without creative labor, which will not be repeated here.

Figure 2:
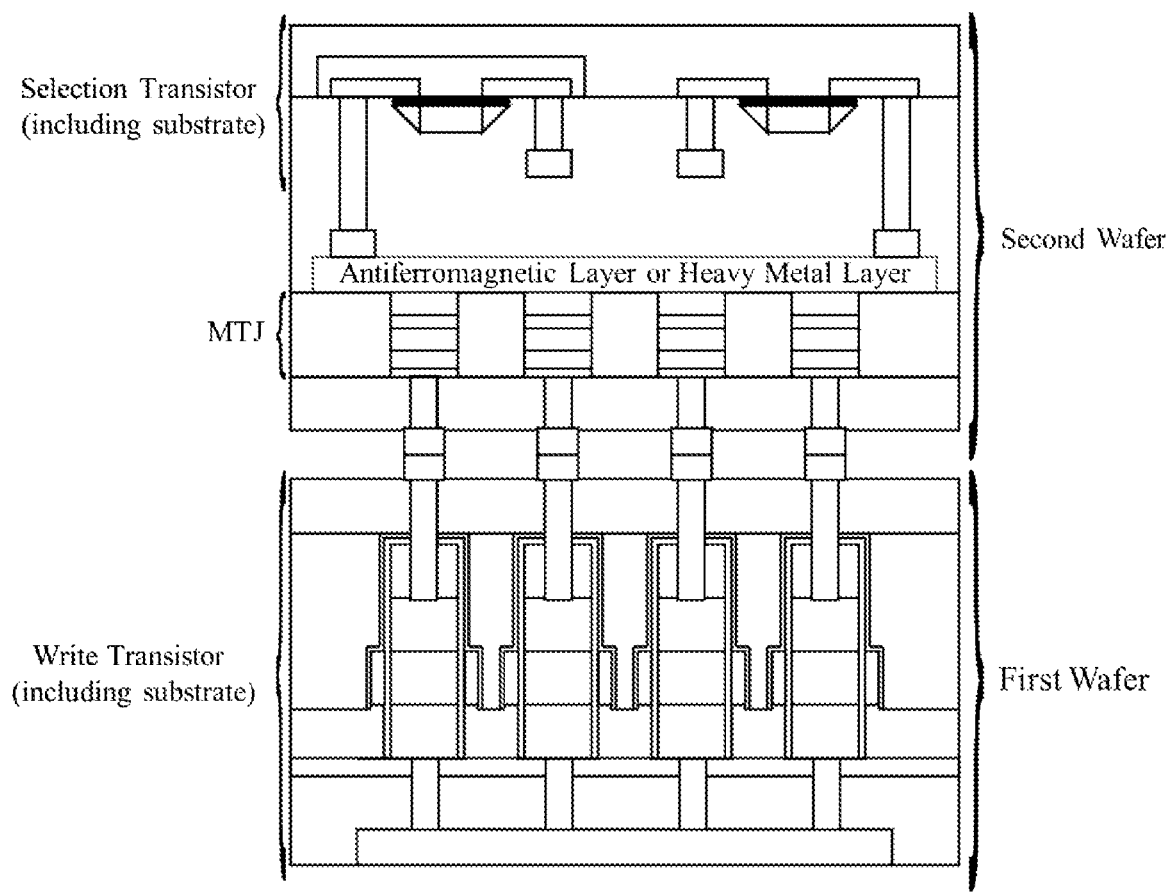
FIG. 2 illustrates a first manufacturing diagram of a magnetic memory according to an embodiment of the present disclosure.

As illustrated in FIG. 2, in some preferred embodiments, all of the write transistors in the memory array are integrated in a first wafer, all of the magnetic tunnel junctions MTJs in the memory array are integrated in a second wafer, and the first wafer and the second wafer are connected together by bonding.

It can be understood that the bonding is a technology in which two pieces of homogeneous or heterogeneous semiconductor materials with clean and atomically-flat surfaces are directly combined under certain conditions after being surface-washed and activated, so that the wafers are bonded as a whole by a Van der Waals force, a molecular force and even an atomic force.

In this embodiment, the bottom-up structure of the first wafer is composed of a substrate and a write transistor from bottom to top from bottom to top; and the structure of the second wafer is composed of a substrate, an antiferromagnetic layer strip film or a heavy metal layer strip film and a magnetic tunnel junction from bottom to top. The two wafers are directly electrically connected by bonding, so that each write transistor is electrically connected to a corresponding magnetic tunnel junction, thereby reducing the number of the transistors and improving the device storage density.

The size of the wafer in the embodiment of the present disclosure may be 1 inch, 2 inches, 3 inches, 4 inches, 6 inches, 8 inches, 12 inches, etc., which is not limited herein. However, the first wafer and the second wafer should be bondable in size, and in particular each write transistor is electrically connected to a corresponding magnetic tunnel junction.

In some preferred embodiments, both the high-level wiring and the low-level wiring are provided with switching elements.

Preferably, the switching element includes an NMOS selection transistor and/or a PMOS selection transistor. With reference to FIG. 1 again, the high-level wiring and the low-level wiring are interconnected with the PMOS selection transistor and the NMOS selection transistor respectively, and each of the NMOS selection transistors or each of the PMOS selection transistors may control the current of a plurality of antiferromagnetic layer strip films or heavy metal layer strip films.

Of course, both the PMOS selection transistor and the NMOS selection transistor are made of a metal oxide semiconductor tube, and used as the switching elements to control the current on the conductor layer in the embodiment of the present disclosure. In specific applications, the high-level wiring may be provided with the NMOS selection transistor or the PMOS selection transistor, and the low-level wiring may also be provided with the NMOS selection transistor or the PMOS selection transistor, which is not limited herein.

In some preferred embodiments, the conductor layer is elongated with a top area greater than bottom areas of all of the magnetic tunnel junctions, and bottom shapes of the magnetic tunnel junctions are completely embedded in a top shape of the conductor layer.

It can be understood that in order to realize a high-density storage and an efficient spin orbit torque write of the Magnetoresistive random access memory, a diameter of a cylindrical tunnel junction is usually less than 50 nm, and a thickness of a wiring conductor layer is required to be less than 5 nm to realize an efficient write process. Also, in order to reduce the high resistance caused by an extremely thin wiring layer, the size of the metal wiring is also limited, wherein the width is substantially close to the diameter of the tunnel junction, and the length depends on the number of the magnetic tunnel junctions.

Of course, only one form of the specific size and the material composition of this embodiment is illustrated here, and those skilled in the art can understand that the selection of the specific size and material will not have a substantive impact. On the premise of not affecting the main idea of the present disclosure, those skilled in the art are able to select other sizes and materials without creative labor, which will not be repeated here.

As can be seen from the above embodiment, the present disclosure applies both STT and SOT effects to the magnetic tunnel junction flipping; compared with the STT-MRAM, the magnetic memory of the present disclosure improves a write speed and a device reliability; and compared with the SOT-MRAM model, the magnetic memory of the present disclosure reduces a circuit static power consumption, decreases the number of the transistors and improves a device storage density.

An embodiment of a second aspect of the present disclosure provides a memory, which includes a plurality of memory array groups, each including a pair of memory arrays, high-level wiring and low-level wiring; the memory array includes a plurality of memory cells arranged in an array and a conductor layer; each of the memory cells includes a write transistor, a first end of which is coupled to top electrode wiring; a magnetic tunnel junction MTJ, an end of which close to a reference layer is coupled to a second end of the write transistor; a side surface of the conductor layer is coupled to end faces of one end of all of the magnetic tunnel junctions MTJs close to a free layer, wherein two ends of the conductor layer are coupled to the high-level wiring and the low-level wiring respectively.

Based on the same inventive concept, the magnetic memory in the embodiment of the present disclosure applies both STT and SOT effects to the magnetic tunnel junction flipping; compared with the STT-MRAM, the magnetic memory improves a write speed and a device reliability; and compared with the SOT-MRAM model, the magnetic memory reduces a circuit static power consumption, decreases the number of the transistors and improves a device storage density.

In some preferred embodiments, the high-level wiring is located between a pair of memory arrays in each of the memory array groups; ends of the conductor layers of the pair of memory arrays close to each other are coupled to the high-level wiring, respectively, and ends of the conductor layer of the pair of memory arrays facing away from each other are coupled to the low-level wiring, respectively.

It can be understood that in order to improve the integration density of the transistors, each pair of memory arrays among the memory arrays in the embodiment of the present disclosure may share one high-level wiring.

Figure 3:
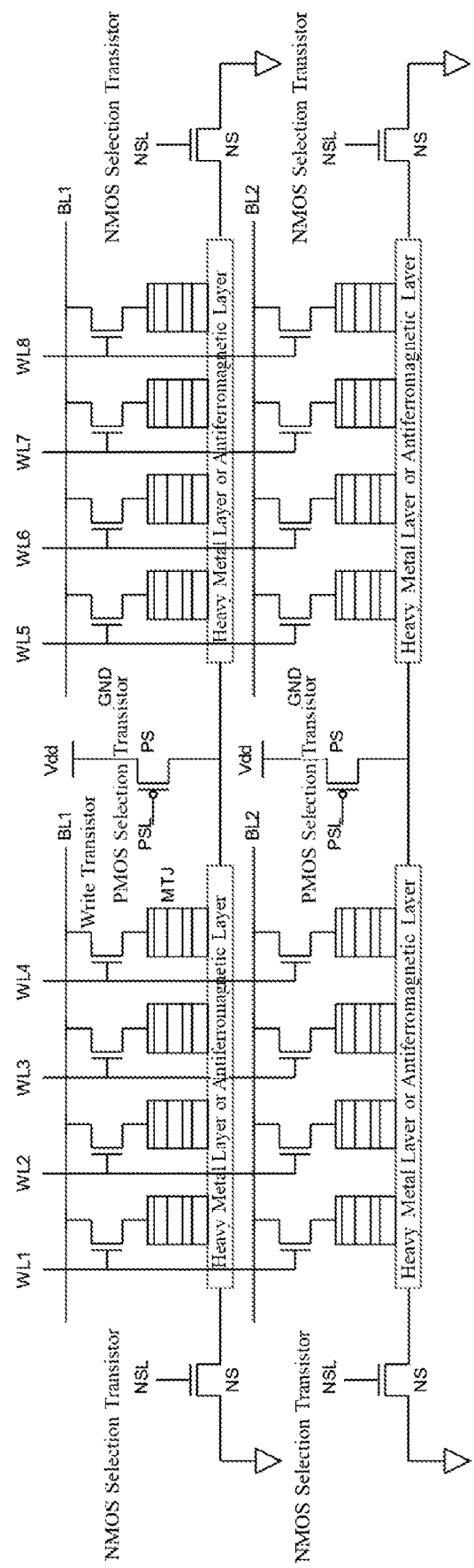
FIG. 3 illustrates a second structural diagram of a three-dimensional high-density NAND magnetic memory according to an embodiment of the present disclosure.

As illustrated in FIG. 3, a three-dimensional high-density NAND magnetic memory has a core structure composed of a magnetic tunnel junction, an antiferromagnetic layer strip film or a heavy metal layer strip film, a write transistor, an NMOS selection transistor and a PMOS selection transistor. The high-level wiring Vdd and the low-level wiring GND are interconnected with one PMOS selection transistor and one NMOS selection transistor, respectively, and each of the PMOS selection transistors may be interconnected with a plurality of conductor layers. In the drawing, each of the antiferromagnetic layer strip films or each of the heavy metal layer strip films is only provided with four magnetic tunnel junctions, but in fact, the number of the magnetic tunnel junctions thereon is determined by the circuit driving capability and is not limited to four. The write transistor used in this embodiment is a vertical fully surrounding gate transistor.

Figure 4:
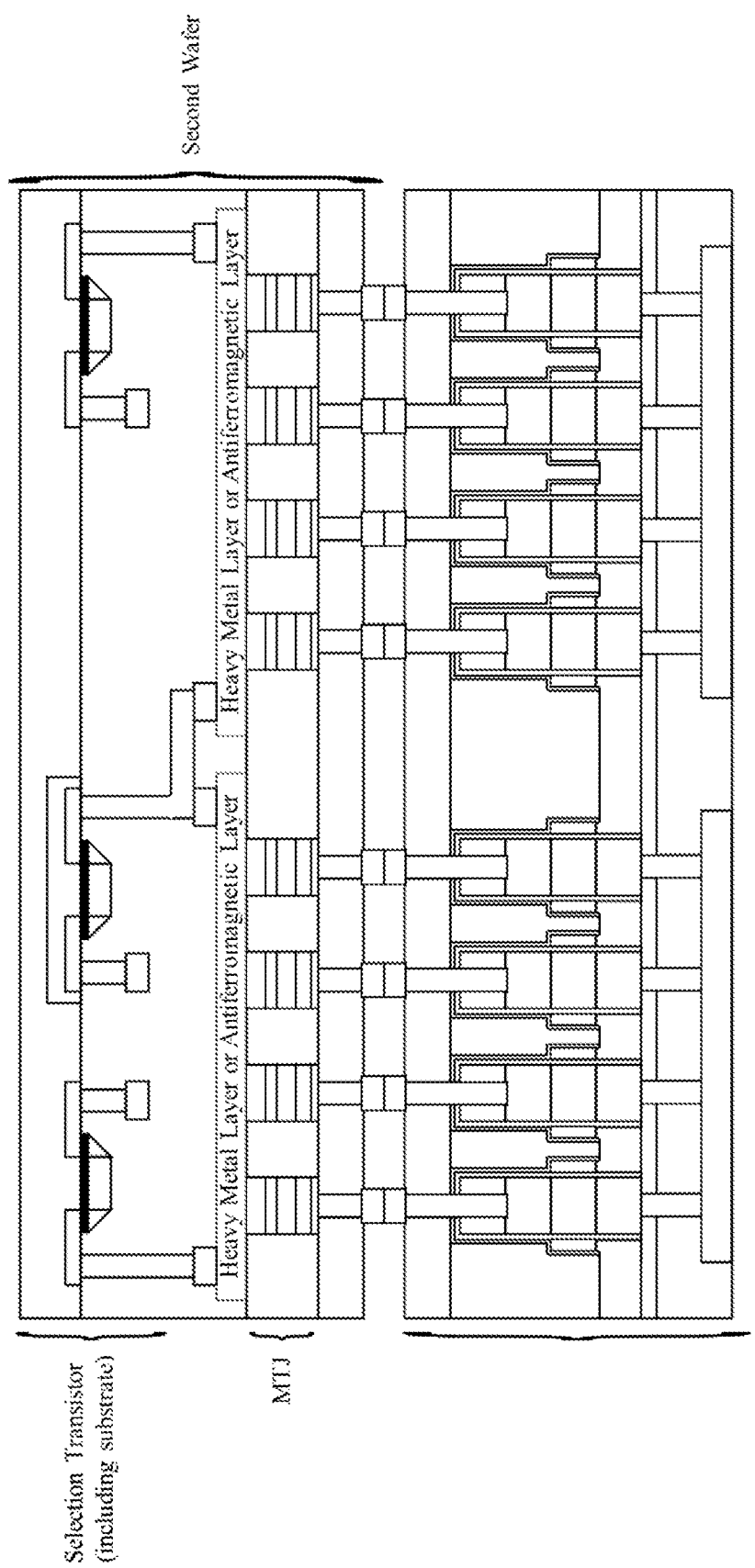
FIG. 4 illustrates a second manufacturing diagram of a magnetic memory according to an embodiment of the present disclosure.

FIG. 4 illustrates another manufacturing diagram of the magnetic memory illustrated in FIG. 3. In this manufacturing, the structure of the first wafer is composed of a substrate and a write transistor from bottom to top, and the structure of the second wafer is composed of a substrate, an NMOS selection transistor and/or a PMOS selection transistor, an antiferromagnetic layer strip film or a heavy metal layer strip film, and a magnetic tunnel junction from bottom to top. The two wafers are directly bonded, so that each of the write transistors is coupled to the magnetic tunnel junction.

In some preferred embodiments, the low-level wiring is located between a pair of memory arrays in each of the memory array groups; ends of the conductor layers of the pair of memory arrays close to each other are coupled to the low-level wiring, respectively, and ends of the conductor layer of the pair of memory arrays facing away from each other are coupled to the high-level wiring, respectively.

Similarly, it can be understood that in order to improve the integration density of the transistors, each pair of memory arrays among the memory arrays in the embodiment of the present disclosure may share one low-level wiring.

Figure 5:
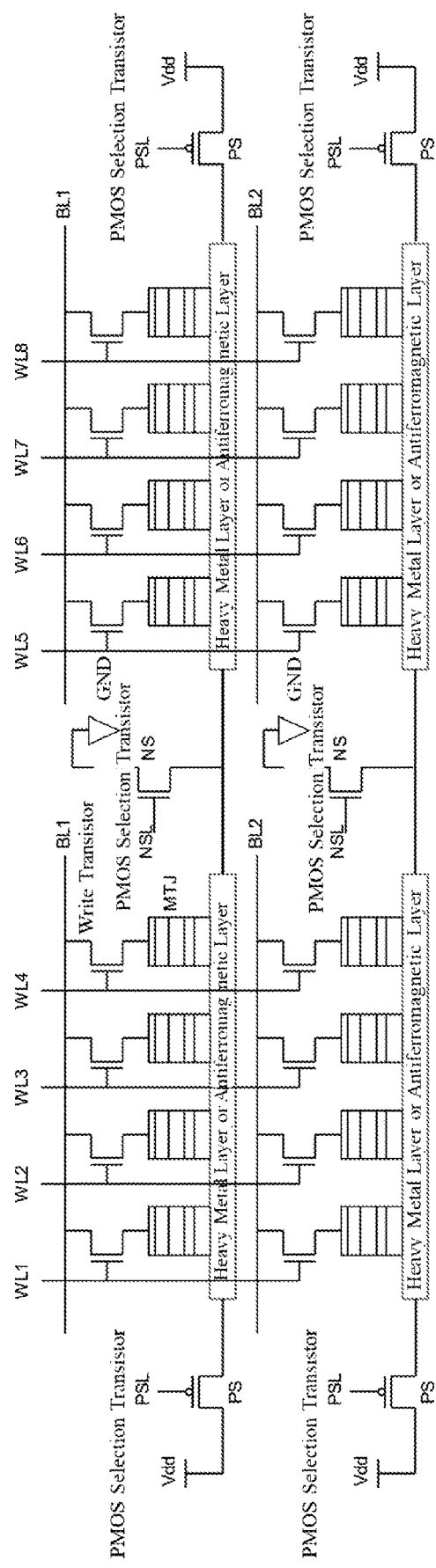
FIG. 5 illustrates a third structural diagram of a three-dimensional high-density NAND magnetic memory according to an embodiment of the present disclosure.

As illustrated in FIG. 5, another three-dimensional high-density NAND magnetic memory has a core structure composed of a magnetic tunnel junction, an antiferromagnetic layer strip film or a heavy metal layer strip film, a write transistor, an NMOS selection transistor and a PMOS selection transistor. The high-level wiring Vdd and the low-level wiring GND are interconnected with one PMOS selection transistor and one NMOS selection transistor, respectively, and each of the NMOS selection transistors may be interconnected with a plurality of conductor layers. In the drawing, each of the antiferromagnetic layer strip films or each of the heavy metal layer strip films is only provided with four magnetic tunnel junctions, but in fact, the number of the magnetic tunnel junctions thereon is determined by the circuit driving capability and is not limited to four. The write transistor used in this embodiment is a vertical fully surrounding gate transistor.

Figure 6:
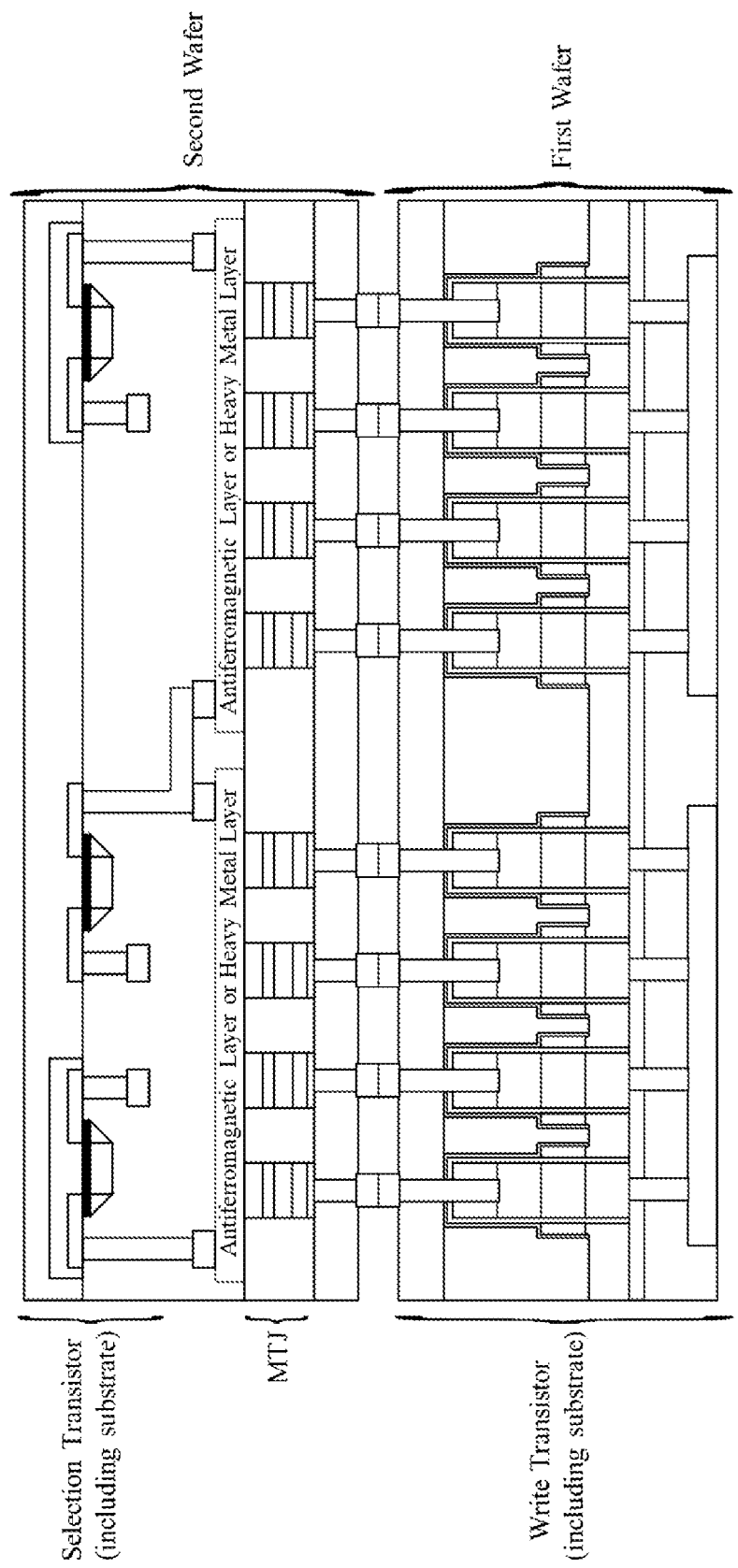
FIG. 6 illustrates a third manufacturing diagram of a magnetic memory according to an embodiment of the present disclosure.

FIG. 6 illustrates another manufacturing diagram of the magnetic memory illustrated in FIG. 5. In this manufacturing, the structure of the first wafer is composed of a substrate and a write transistor from bottom to top, and the structure of the second wafer is composed of a substrate, an NMOS/PMOS selection transistor/a driving circuit, an antiferromagnetic layer strip film or a heavy metal layer strip film, and a magnetic tunnel junction from bottom to top. The two wafers are directly bonded, so that each of the transistors is coupled to the magnetic tunnel junction.

Figure 7:
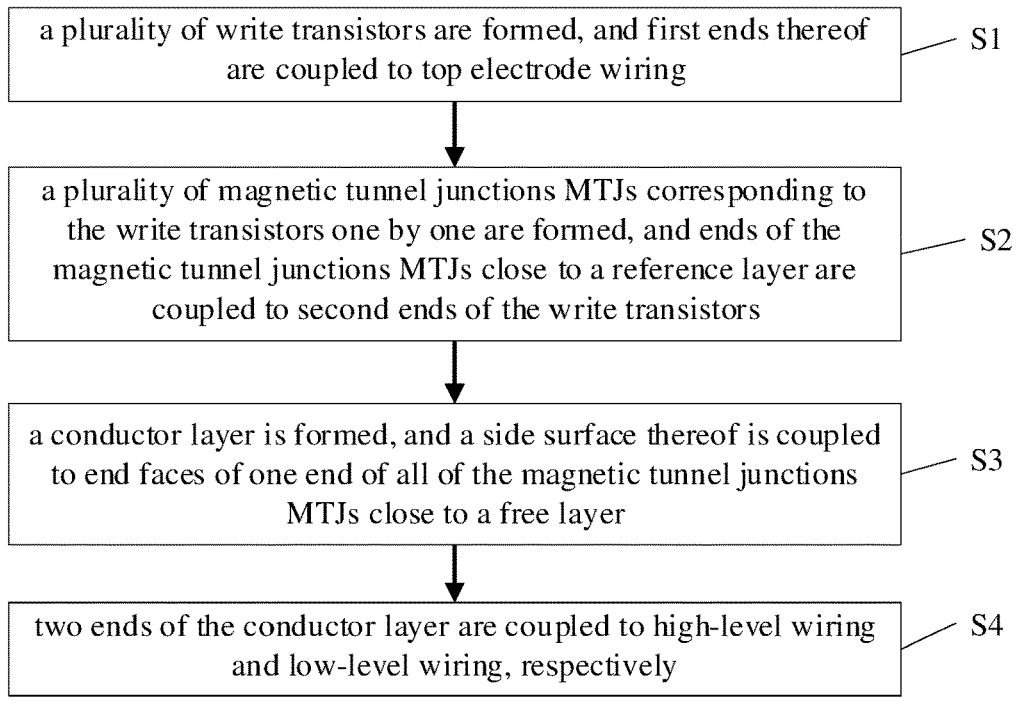
FIG. 7 illustrates a flowchart of a method for preparing a memory array according to an embodiment of the present disclosure.

As illustrated in FIG. 7, a third aspect of the present disclosure provides a method for preparing a memory array, the method including:

S1: a plurality of write transistors are formed, and first ends thereof are coupled to top electrode wiring;

S2: a plurality of magnetic tunnel junctions MTJs corresponding to the write transistors one by one are formed, and ends of the magnetic tunnel junctions MTJs close to a reference layer are coupled to second ends of the write transistors;

S3: a conductor layer is formed, and a side surface thereof is coupled to end faces of one end of all of the magnetic tunnel junctions MTJs close to a free layer;

S4: two ends of the conductor layer are coupled to high-level wiring and low-level wiring, respectively.

In some preferred embodiments, the forming a plurality of write transistors includes: integrating the plurality of write transistors in a first wafer; the forming a plurality of magnetic tunnel junctions MTJs corresponding to the write transistors one by one includes: integrating the plurality of magnetic tunnel junctions MTJs in a second wafer; the coupling ends of the magnetic tunnel junctions MTJs close to a reference layer to second ends of the write transistors includes: bonding the first wafer and the second wafer.

Figure 8:
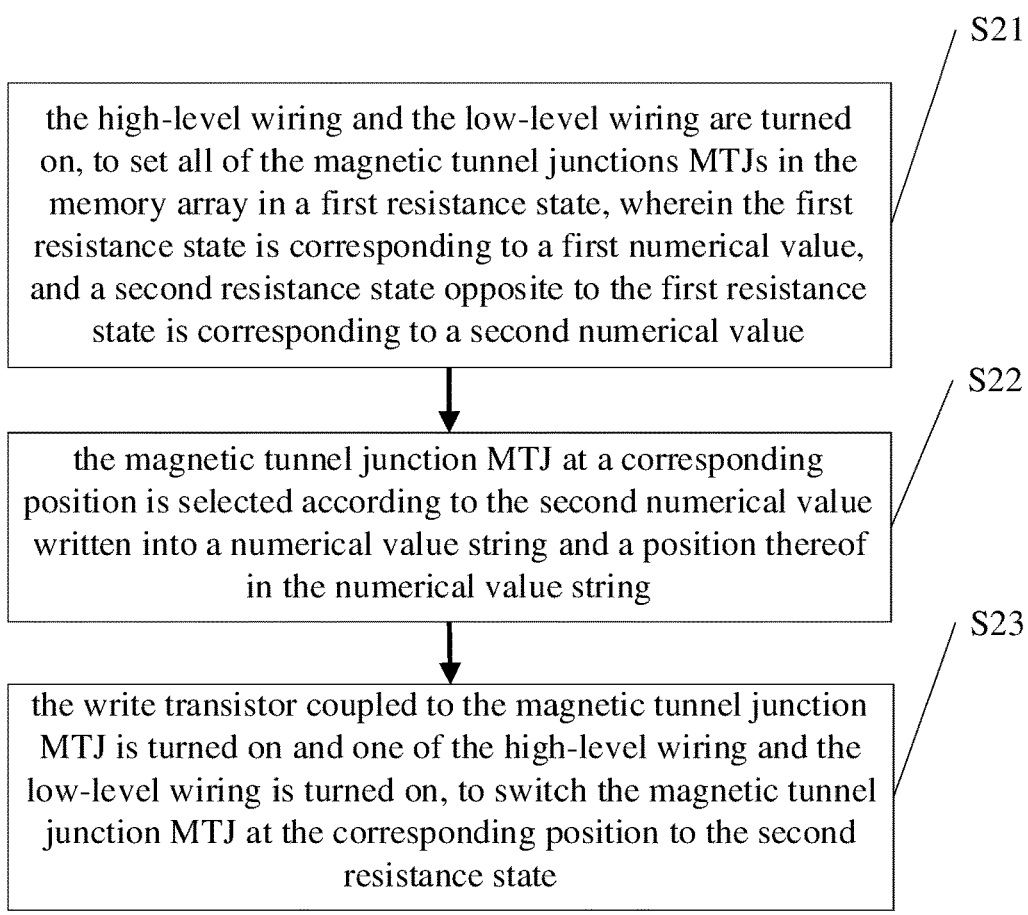
FIG. 8 is a flowchart of a method for writing data in a memory array according to an embodiment of the present disclosure.

As illustrated in FIG. 8, an embodiment of a fourth aspect of the present disclosure provides a method for writing data using the memory array as described in the embodiment of first aspect, the method including:

S21: the high-level wiring and the low-level wiring are turned on, to set all of the magnetic tunnel junctions MTJs in the memory array in a first resistance state, wherein the first resistance state is corresponding to a first numerical value, and a second resistance state opposite to the first resistance state is corresponding to a second numerical value;

S22: the magnetic tunnel junction MTJ at a corresponding position is selected according to the second numerical value written into a numerical value string and a position thereof in the numerical value string;

S23: the write transistor coupled to the magnetic tunnel junction MTJ is turned on and one of the high-level wiring and the low-level wiring is turned on, to switch the magnetic tunnel junction MTJ at the corresponding position to the second resistance state.

With reference to FIG. 1 again, firstly, unidirectional current is applied between the high-level wiring Vdd and the low-level wiring GND, and all of the magnetic tunnel junctions are written into a high-resistance state, i.e., all of the magnetic tunnel junctions represent data '0'; next, the magnetic tunnel junction MTJ at a corresponding position is selected according to the second numerical value '1' written into a numerical value string and a position thereof in the numerical value string; finally, one of the high-level wiring and the low-level wiring is turned on to form unidirectional current with the X-th top electrode, to switch the magnetic tunnel junction MTJ at the corresponding position to the second resistance state '1'.

It can be understood that a write mode based on the STT effect can be formed by turning on either of the high-level wiring and the low-level wiring.

The technical effects of the memory, the method for preparing the memory array and the method for writing data into the memory array are all based on the characteristics of the memory array in the present disclosure described above, so corresponding use effects can be achieved, which will not be repeated here.

In the description of the present disclosure, the description of reference terms 'one embodiment', 'some embodiments', 'an example', 'a specific example' or 'some examples' and the like mean that the specific features, structures, materials, or characteristics described in conjunction with the embodiment(s) or example(s) are included in at least one embodiment or example of the present disclosure. In the present disclosure, the schematic expressions of the above terms do not necessarily aim at the same embodiment or example.

In addition, a person skilled in the art may combine different embodiments or examples described in the present disclosure and features thereof if there is no contradiction. Those described above are just examples of one or more embodiments of the present disclosure, rather than limitations thereto. For a person skilled in the art, one or more embodiments of the present disclosure may have various amendments or variations. Any amendment, equivalent substitution, improvement, etc. made under the principle of the present disclosure should fall within the scope of the claims.

What is claimed is:

1. A memory array, comprising:
   a plurality of memory cells arranged in an array and a conductor layer;
   each of the memory cells comprising:
   a write transistor configured to couple a first end thereof to top electrode wiring, the write transistor comprising at least one of a conventional transistor, a tunneling field effect transistor, a FinFET, or a vertical fully surrounding gate transistor; and
   a magnetic tunnel junction (MTJ) configured to couple one end thereof close to a reference layer to a second end of the write transistor,
   wherein, a side surface of the conductor layer is coupled to an end face close to a free layer, of each MTJ of each memory cell, respectively; two ends of the conductor layer are coupled to high-level wiring VDD and low-level wiring GND, respectively; the write transistors in each memory cell are integrated in a first wafer, the MTJs in each memory cell are integrated in a second wafer, and the first wafer and the second wafer are connected together by bonding, aiming to couple the writing transistors to corresponding MTJs.

2. The memory array according to claim 1, wherein both the high-level wiring VDD and the low-level wiring GND are provided with switching elements.

3. The memory array according to claim 1, wherein, the conductor layer is elongated with a top area greater than bottom areas of all of the magnetic tunnel junctions, and a bottom shape of the magnetic tunnel junctions are completely embedded in a top shape of the conductor layer.

4. A memory, comprising: a plurality of memory array groups, each comprising a pair of memory arrays, high-level wiring VDD and low-level wiring GND;
   the memory array comprising a plurality of memory cells arranged in an array and a conductor layer;
   each of the memory cells comprising:
   a write transistor configured to couple a first end thereof to top electrode wiring, the write transistor comprising at least one of a conventional transistor, a tunneling field effect transistor, a FinFET, or a vertical fully surrounding gate transistor; and
   an MTJ configured to couple an end thereof close to a reference layer to a second end of the write transistor,
   wherein, a side surface of the conductor layer is coupled to an end face close to a free layer, of each MTJs of each memory cell, respectively, and two ends of the conductor layer are coupled to the high-level wiring VDD and the low-level wiring GND respectively;
   wherein the write transistors in each memory cell are integrated in a first wafer, the MTJs in each memory cell are integrated in a second wafer, and the first wafer and the second wafer are connected together by bonding, aiming to couple the writing transistors to corresponding MTJs.

5. The memory according to claim 4, wherein the high-level wiring VDD is located between a pair of memory arrays in each of the memory array groups; the ends of the conductor layers of the pair of memory arrays close to each other are coupled to the high-level wiring VDD, respectively, and the ends of the conductor layers of the pair of memory arrays facing away from each other are coupled to the low-level wiring GND, respectively.

6. The memory according to claim 4, wherein the low-level wiring GND is located between a pair of memory arrays in each of the memory array groups; the ends of the conductor layers of the pair of memory arrays close to each other are coupled to the low-level wiring GND, respectively, and the ends of the conductor layers of the pair of memory arrays facing away from each other are coupled to the high-level wiring VDD, respectively.

7. A method for preparing a memory array according to claim 1, comprising:
   integrating a plurality of write transistors in a first wafer, and coupling first ends thereof to top electrode wiring;
   integrating a plurality of MTJs corresponding to the write transistors one by one in a second wafer;
   bonding the first wafer and the second wafer, aiming to couple ends of the MTJs close to a reference layer to second ends of the write transistors;
   forming a conductor layer, and coupling a side surface thereof to an end face close to a free layer, of each MTJ integrated into the second wafer; and
   coupling two ends of the conductor layer to high-level wiring VDD and low-level wiring GND, respectively.

8. A method for writing data using the memory array according to claim 1, comprising:
   turning on the high-level wiring VDD and the low-level wiring GND, to set all of the MTJs in the memory array in a first resistance state, wherein the first resistance state is corresponding to a first numerical value, and a second resistance state opposite to the first resistance state is corresponding to a second numerical value;
   selecting the MTJ at a corresponding position according to the second numerical value written into a numerical value string and a position thereof in the numerical value string; and
   turning on the write transistor coupled to the MTJ and turning on one of the high-level wiring VDD and the low-level wiring GND, to switch the MTJ at the corresponding position to the second resistance state.

* * * * *